(12) United States Patent
Furukawa

(10) Patent No.: US 10,807,128 B2
(45) Date of Patent: Oct. 20, 2020

(54) PARTICLE REMOVAL METHOD AND HEAT TREATMENT APPARATUS

(71) Applicant: SCREEN Holdings Co., Ltd., Kyoto (JP)

(72) Inventor: Masashi Furukawa, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/040,603

(22) Filed: Jul. 20, 2018

(65) Prior Publication Data

US 2019/0084014 A1 Mar. 21, 2019

(30) Foreign Application Priority Data

Sep. 20, 2017 (JP) ................................ 2017-180195

(51) Int. Cl.
| | | |
|---|---|---|
| *B08B 7/00* | (2006.01) | |
| *H01L 21/67* | (2006.01) | |
| *B08B 9/08* | (2006.01) | |
| *B08B 7/04* | (2006.01) | |
| *B08B 5/00* | (2006.01) | |

(52) U.S. Cl.
CPC .............. *B08B 7/0035* (2013.01); *B08B 5/00* (2013.01); *B08B 7/04* (2013.01); *B08B 9/08* (2013.01); *H01L 21/67028* (2013.01); *H01L 21/67115* (2013.01); *B08B 7/0071* (2013.01)

(58) Field of Classification Search
None
See application file for complete search history.

(56) References Cited

U.S. PATENT DOCUMENTS

| | | | |
|---|---|---|---|
| 2003/0081945 A1 | 5/2003 | Kusuda | |
| 2005/0047767 A1 | 3/2005 | Nozaki | ........................ 392/416 |
| 2013/0260546 A1 | 10/2013 | Yamada et al. | |
| 2017/0062223 A1 | 3/2017 | Aoyama et al. | |

FOREIGN PATENT DOCUMENTS

| | | |
|---|---|---|
| JP | 2005-0072291 A | 3/2005 |
| JP | 2005-072291 A | 3/2005 |
| JP | 2013-207033 A | 10/2013 |
| KR | 10-2003-0035895 A | 5/2003 |

OTHER PUBLICATIONS

Notification of Reason for Refusal dated Aug. 21, 2019 in counterpart Korean Patent Application No. 10-2018-0102815 and English translation obtained from Global Dossier.
Office Action and Search Report dated Jan. 28, 2019 in counterpart Taiwanese Application No. 107124624 and English partial translation based on the Japanese translation (attached).

*Primary Examiner* — Eric W Golightly
(74) *Attorney, Agent, or Firm* — Ostrolenk Faber LLP

(57) ABSTRACT

When a chamber of a heat treatment apparatus is opened for a purpose such as maintenance of the heat treatment apparatus, particles flow in large quantities into the chamber together with an outside atmosphere. After maintenance work is finished, an enclosed space is formed in the chamber and gas in the chamber is exhausted to place the interior of the chamber in a reduced-pressure atmosphere. While the interior of the chamber is in the reduced-pressure atmosphere, the interior of the chamber is irradiated with a flash of light emitted multiple times from a flash lamp to cause momentary gas expansion and subsequent gas shrinkage repeatedly, thereby causing particles adhering in the chamber to fly. The flying particles are discharged from the chamber to remove the particles.

5 Claims, 11 Drawing Sheets

F I G . 3
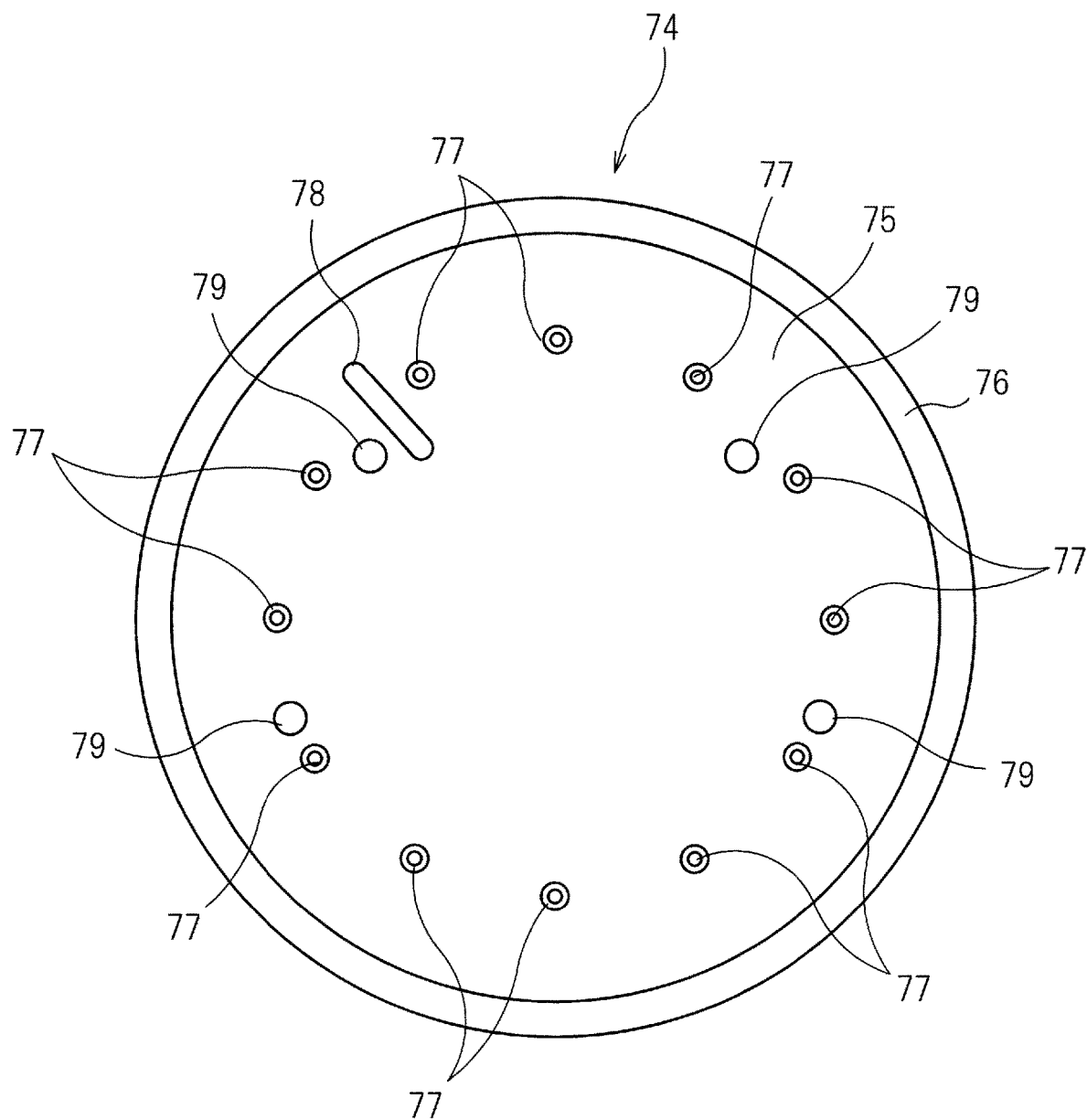

F I G . 4
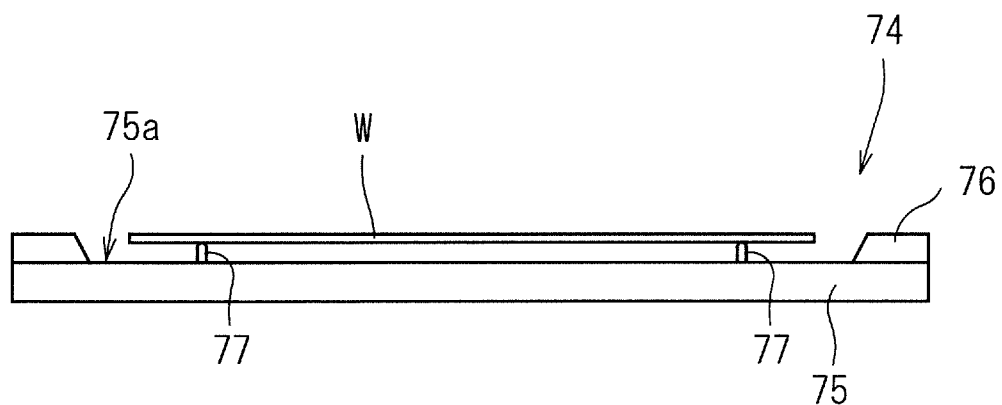

F I G. 7
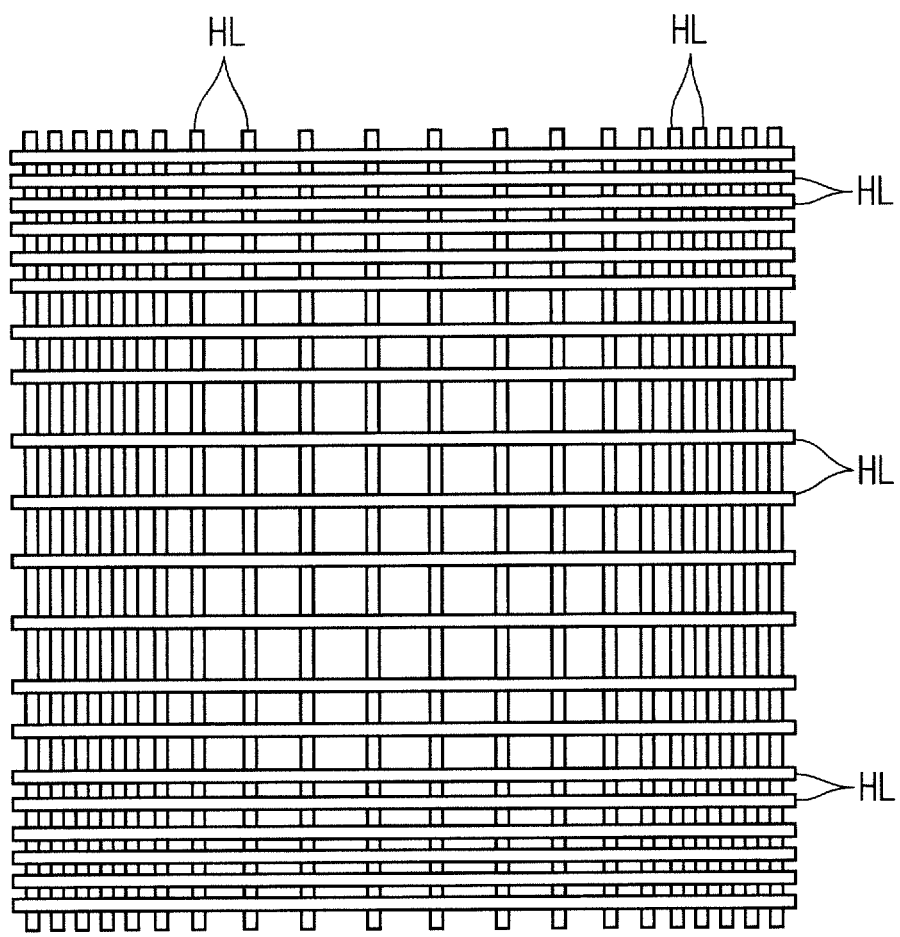

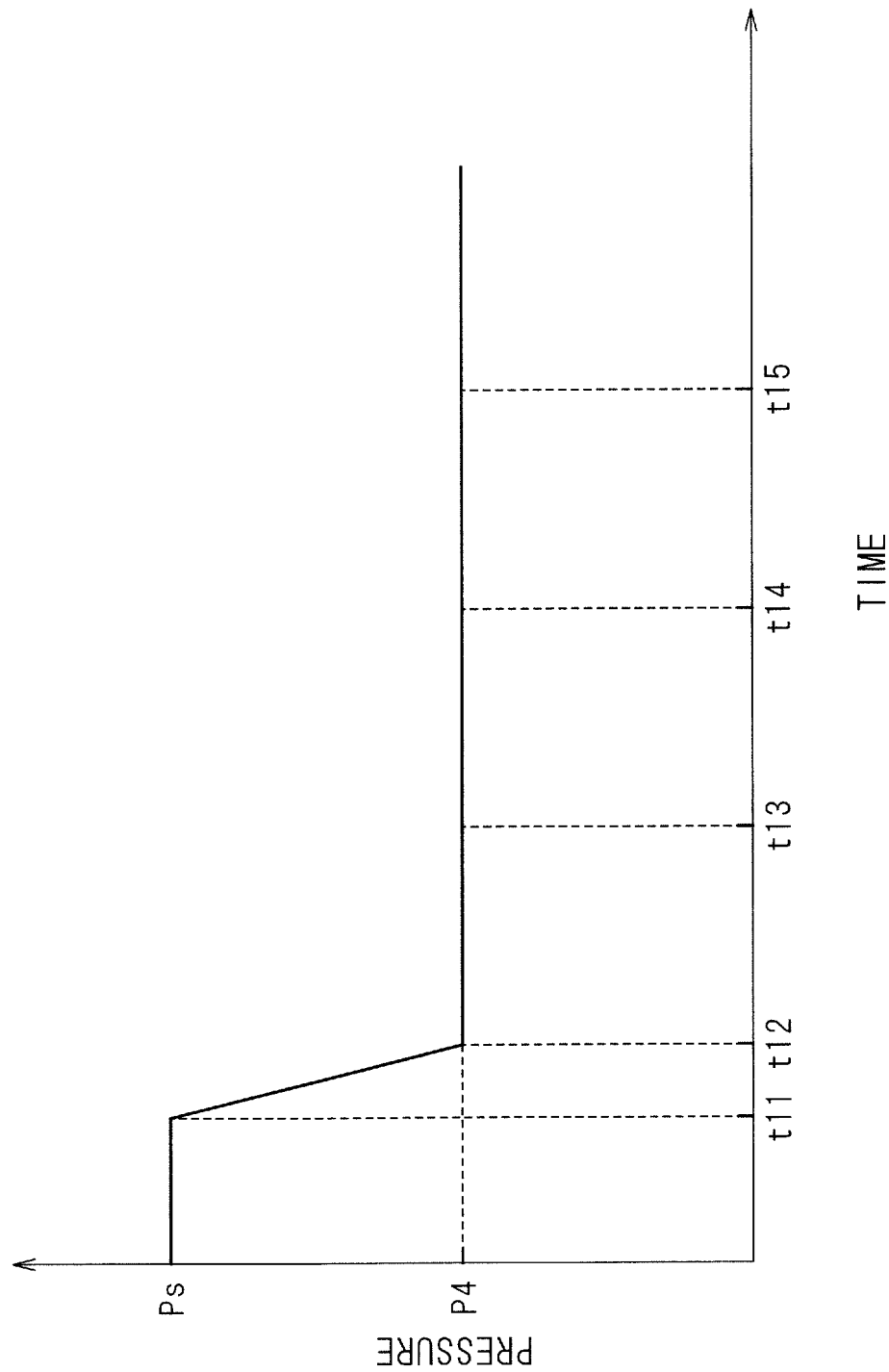

PARTICLE REMOVAL METHOD AND HEAT TREATMENT APPARATUS

BACKGROUND OF THE INVENTION

Field of the Invention

The present invention relates to a heat treatment apparatus for irradiating a thin plate-like precision electronic substrate (hereinafter referred to simply as a "substrate") such as a semiconductor wafer with a flash of light to heat the substrate, and a particle removal method of removing particles from the heat treatment apparatus.

Description of the Background Art

In the process of manufacturing a semiconductor device, attention has been given to flash lamp annealing (FLA) that is an annealing technique for heating a semiconductor wafer in an extremely short time period. The flash lamp annealing is a heat treatment technique in which xenon flash lamps (the term "flash lamp" as used hereinafter refers to a "xenon flash lamp") are used to irradiate a surface of a semiconductor wafer with flashes of light, thereby increasing the temperature of only the surface of the semiconductor wafer in an extremely short time period (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with flashes of light emitted from the xenon flash lamps, the temperature of the semiconductor wafer can be increased rapidly, with only a small amount of light transmitted through the semiconductor wafer. Also, it has turned out that flash irradiation, that is, the irradiation of a semiconductor wafer with a flash of light in an extremely short time period of several milliseconds or less allows a selective temperature increase only near the surface of the semiconductor wafer.

Such flash lamp annealing is used for treatment requiring heating in an extremely short time period, typically, activation of impurities implanted into a semiconductor wafer. Irradiating a surface of the semiconductor wafer with impurities implanted by ion implantation process with a flash of light emitted from a flash lamp allows temperature increase of the surface of the semiconductor wafer to an activation temperature only for an extremely short time period. This allows only activation of the impurities without causing deep diffusion of the impurities.

In a flash lamp annealer, a chamber for heat treatment on a semiconductor wafer may be opened to be exposed to the atmosphere for a purpose such as maintenance. Once the interior of the chamber is exposed to the atmosphere, particles flow into the chamber accordingly. Hence, particles remain in large quantities in the chamber after completion of the maintenance. In particular, in the flash lamp annealing, a surface of a semiconductor wafer is increased in temperature in an extremely short time period by irradiation with a flash of light having intense energy and emitted for an extremely short time period. This causes steep thermal expansion only at the surface and its vicinity of the semiconductor wafer, so that the semiconductor wafer may crack in the chamber. On the occurrence of the crack in the semiconductor wafer, even if the interior of the chamber is cleaned by opening the chamber and collecting broken pieces of the semiconductor wafer, tiny particles still remain in large quantities in the chamber. It is considerably difficult to remove such tiny particles from the chamber.

In this regard, according to a technique suggested in US 2005/0047767, a flash lamp is turned on after completion of maintenance while a semiconductor wafer does not exist in a chamber to expand and shrink gas in the chamber momentarily. This causes particles to fly, and the flying particles are discharged to the outside of the chamber in a flow of nitrogen gas, thereby removing the particles in a simple way.

However, to satisfy a required standard that has become stricter in recent years for the number of particles permitted to exist on a semiconductor wafer, the number of particles adhering to the semiconductor wafer during treatment is required to be reduced by removing particles from a chamber with a higher degree of accuracy.

SUMMARY OF THE INVENTION

The present invention is intended for a particle removal method of removing particles from a heat treatment apparatus for heating a substrate by irradiating the substrate with a flash of light.

According to one aspect of the present invention, in the particle removal method, while the interior of a chamber of the heat treatment apparatus is placed in a reduced-pressure atmosphere by exhausting gas in the chamber, the interior of the chamber is irradiated with a flash of light emitted multiple times from a flash lamp to discharge particles flying in the chamber.

This allows removal of particles in the chamber with a high degree of accuracy. Preferably, in the particle removal method, the interior of the chamber is placed in the reduced-pressure atmosphere by exhausting gas in the chamber while gas is supplied into the chamber.

This allows discharge of particles efficiently from the chamber using a flow of the supplied gas.

Preferably, in the particle removal method, the interior of the chamber is irradiated with the flash of light while transport of a substrate into the chamber is prohibited.

This makes it possible to prevent the occurrence of additional particles due to a crack in a substrate caused by flash irradiation.

Preferably, in the particle removal method, the interior of the chamber is irradiated with the flash of light while a substrate is held in the chamber.

This allows removal of flying particles by causing the particles to adhere to the substrate.

Preferably, in the particle removal method, the interior of the chamber is heated by being irradiated with light from a continuous lighting lamp at least before the irradiation with the flash of light.

This generates convection in the chamber to allow discharge of particles efficiently.

Preferably, the flash of light has energy equal to or greater than the energy of a flash of light to be emitted from the flash lamp to a substrate as a target of treatment.

This makes it possible to prevent additional particles from flying during treatment on the substrate as a target.

The present invention is further intended for a heat treatment apparatus for heating a substrate by irradiating the substrate with a flash of light.

According to one aspect of the present invention, the heat treatment apparatus comprises: a chamber for receiving a substrate therein; an exhaust part for exhausting gas in the chamber; and a flash lamp for irradiating the interior of the chamber with a flash of light. While the exhaust part places the interior of the chamber in a reduced-pressure atmosphere by exhausting gas in the chamber, the interior of the chamber is irradiated with a flash of light emitted multiple times from the flash lamp to discharge particles flying in the chamber.

This allows removal of particles in the chamber with a high degree of accuracy.

Preferably, the heat treatment apparatus further comprises a gas supply part for supplying gas into the chamber, and the interior of the chamber is placed in the reduced-pressure atmosphere by exhausting gas in the chamber using the exhaust part while gas is supplied into the chamber from the gas supply part.

This allows discharge of particles efficiently from the chamber using a flow of the supplied gas.

Preferably, the interior of the chamber is irradiated with the flash of light emitted from the flash lamp while transport of a substrate into the chamber is prohibited.

This makes it possible to prevent the occurrence of additional particles due to a crack in a substrate caused by flash irradiation.

Preferably, the heat treatment apparatus further comprises a holder for holding a substrate in the chamber, and the interior of the chamber is irradiated with the flash of light emitted from the flash lamp while a substrate is held by the holder.

This allows removal of flying particles by causing the particles to adhere to the substrate.

Preferably, the heat treatment apparatus further comprises a continuous lighting lamp for irradiating the interior of the chamber with light, and the interior of the chamber is heated by being irradiated with light from the continuous lighting lamp at least before the irradiation with the flash of light emitted from the flash lamp.

This generates convection in the chamber to allow discharge of particles efficiently.

Preferably, the flash of light has energy equal to or greater than the energy of a flash of light to be emitted from the flash lamp to a substrate as a target of treatment.

This makes it possible to prevent additional particles from flying during treatment on the substrate as a target.

It is therefore an object of the present invention to remove particles in the chamber with a high degree of accuracy.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view of a susceptor;

FIG. 4 is a sectional view of the susceptor;

FIG. 7 is a plan view showing an arrangement of halogen lamps;

FIG. 11 shows pressure change in a chamber according to a second preferred embodiment.

DESCRIPTION OF THE PREFERRED EMBODIMENTS

Preferred embodiments according to the present invention will now be described in detail with reference to the drawings.

First Preferred Embodiment

Figure 1:
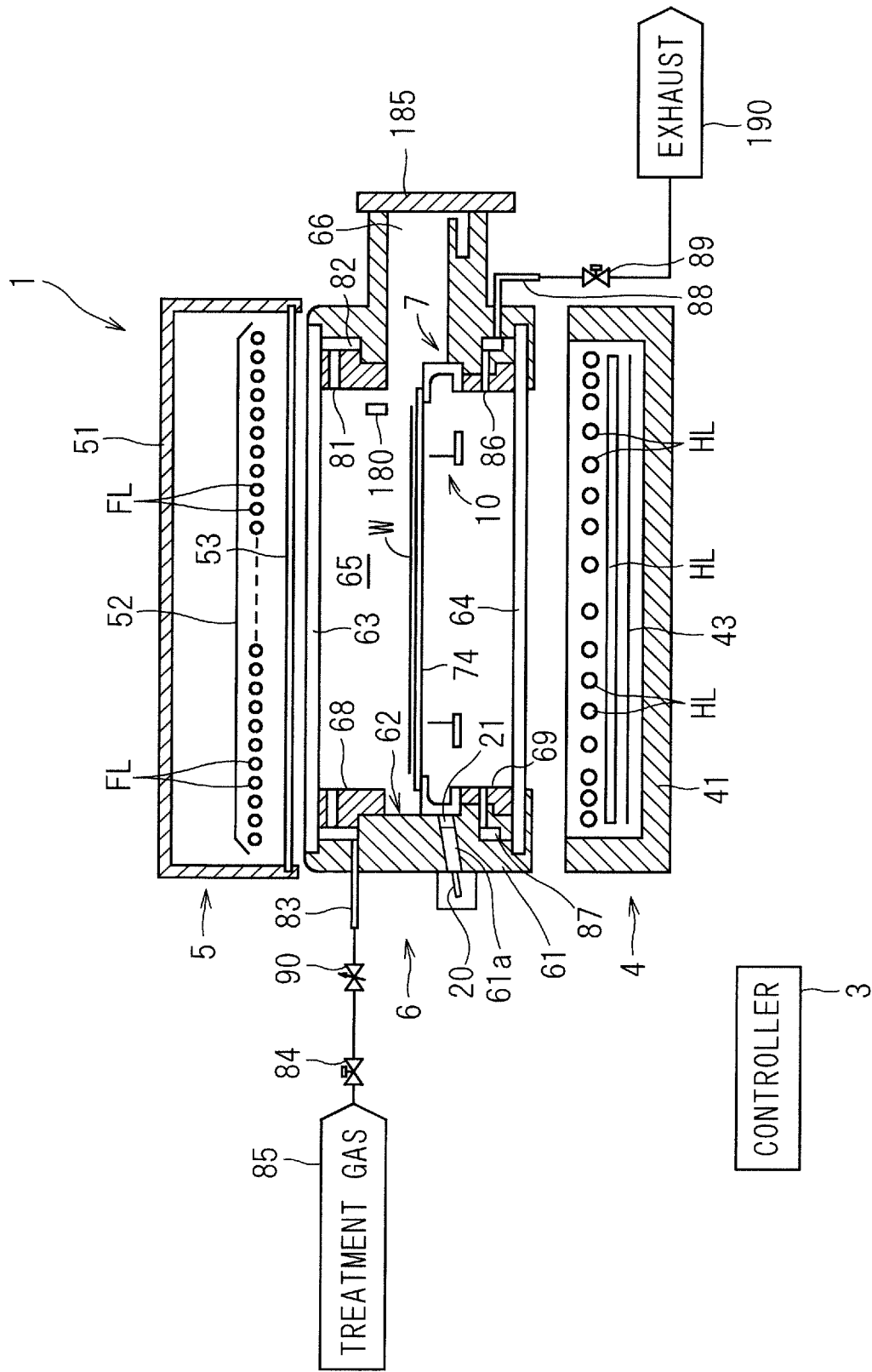
FIG. 1 is a longitudinal sectional view showing the configuration of a heat treatment apparatus according to the present invention.

FIG. 1 is a longitudinal sectional view showing the configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W as a target is not particularly limited. For example, the semiconductor wafer W as a target has a diameter of 300 mm or 450 mm (in this preferred embodiment, 300 mm). It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured in such a manner that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 becomes an enclosed space.

The chamber side portion 61 is further provided with a through hole 61a bored therein. A radiation thermometer 20 is mounted to a location of an outer wall surface of the chamber side portion 61 where the through hole 61a is provided. The through hole 61a is a cylindrical hole for directing infrared radiation emitted from the lower surface of a semiconductor wafer W held by a susceptor 74 to be described later therethrough to the radiation thermometer 20. The through hole 61a is inclined with respect to a horizontal direction so that a longitudinal axis (an axis extending in a direction in which the through hole 61a extends through the chamber side portion 61) of the through hole 61a intersects a main surface of the semiconductor wafer W held by the susceptor 74. A transparent window 21 made of a barium fluoride material transparent to infrared radiation in a wavelength range measurable with the radiation thermometer 20 is mounted to an end portion of the through hole 61a which faces the heat treatment space 65.

A gas supply opening 81 for supplying treatment gas (in this preferred embodiment, nitrogen gas ($N_2$) or mixed gas containing ammonia ($NH_3$) and nitrogen gas) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. The treatment gas supply source 85 supplies nitrogen gas or mixed gas containing ammonia and nitrogen gas as treatment gas to the gas supply pipe 83 under control by the controller 3. A supply valve 84 and a flow rate adjusting valve 90 are inserted at some midpoints in the gas supply pipe 83. When the supply valve 84 is opened, the treatment gas is supplied from the treatment gas supply source 85 to the buffer space 82. The flow rate of the treatment gas flowing through the gas supply pipe 83 to be supplied to the buffer space 82 is adjusted by the flow rate adjusting valve 90. The flow rate of the treatment gas determined by the flow rate adjusting valve 90 is changeable under control by the controller 3. The treatment gas entering the buffer space 82 flows in a spreading manner within the buffer space 82 which is lower in fluid resistance than the gas supply opening 81, and is supplied through the gas supply opening 81 into the heat treatment space 65. The treatment gas is not limited to nitrogen gas or ammonia but may be inert gas such as argon (Ar) or helium (He), or reactive gas such as oxygen ($O_2$), hydrogen ($H_2$), chlorine ($Cl_2$), hydrogen chloride (HCl), ozone ($O_3$), nitrogen monoxide (NO), nitrous oxide ($N_2O$), or nitrogen dioxide ($NO_2$), for example.

A gas exhaust opening 86 for exhausting gas in the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. An exhaust valve 89 is inserted at a midpoint in the gas exhaust pipe 88. When the exhaust valve 89 is opened, gas in the heat treatment space 65 passes through the gas exhaust opening 86 and the buffer space 87 to be exhausted to the gas exhaust pipe 88. The gas supply opening 81 and the gas exhaust opening 86 may include a plurality of gas supply openings 81 and gas exhaust openings 86 arranged in the peripheral direction of the chamber 6. Alternatively, the gas supply opening 81 and the gas exhaust opening 86 may be slit-like openings.

Figure 8:
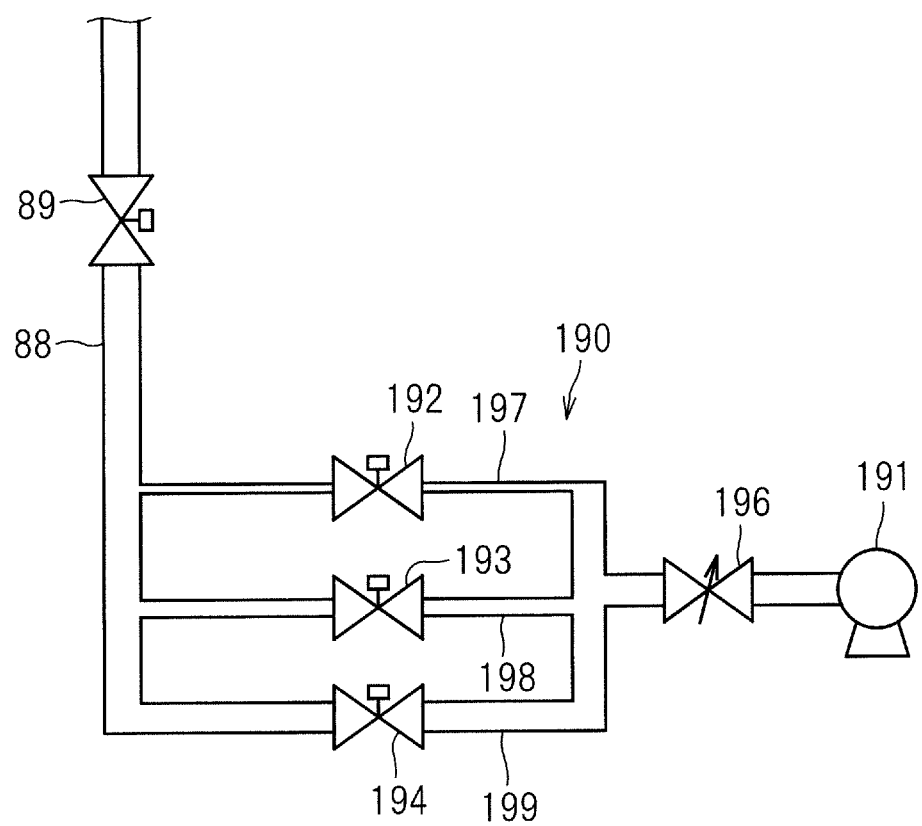
FIG. 8 shows the configuration of an exhaust part.

FIG. 8 shows the configuration of the exhaust part 190. The exhaust part 190 includes an exhaust pump 191, a flow rate adjusting valve 196, three bypass lines 197, 198, and 199, and three exhaust valves 192, 193, and 194. The gas exhaust pipe 88 for guiding gas exhausted from the chamber 6 and the exhaust pump 191 are connected through the three bypass lines 197, 198, and 199. The three bypass lines 197, 198, and 199 are arranged in parallel. The three bypass lines 197, 198, and 199 have pipe diameters differing from each other. The bypass line 197 has the smallest diameter and the bypass line 199 has the largest diameter. The diameter of the bypass line 198 is intermediate between the diameters of the bypass lines 197 and 199. Thus, gas capable of passing through the bypass lines 197, 198, and 199 flows at a rate increasing in the following order: bypass line 197, bypass line 198, and bypass line 199.

The three exhaust valves 192, 193, and 194 are provided at the three bypass lines 197, 198, and 199 respectively. Specifically, the exhaust valve 192 is inserted in the bypass line 197. The exhaust valve 193 is inserted in the bypass line 198. The exhaust valve 194 is inserted in the bypass line 199. By opening the three exhaust valves 192, 193, and 194 while actuating the exhaust pump 191, gas exhausted from the chamber 6 and guided through the gas exhaust pipe 88 passes through the bypass lines 197, 198, and 199 corresponding to the exhaust valves 192, 193, and 194 respectively, and is sucked into the exhaust pump 191.

The three bypass lines 197, 198, and 199 have different pipe diameters and thus have different exhaust capabilities. A larger pipe diameter results in higher exhaust capability, so that exhaust capability is increased in the following order: bypass line 197, bypass line 198, and bypass line 199. Thus, the flow rate of gas exhausted from the chamber 6 is allowed to be controlled by determining which one of the three exhaust valves 192, 193, and 194 is to be opened and closed. Only one, or two or all of the three exhaust valves 192, 193, and 194 may be opened. For example, opening only the exhaust valve 192 while closing the exhaust valves 193 and 194 results in exhaust at the lowest flow rate. Opening all the three exhaust valves 192, 193, and 194 results in exhaust at the highest flow rate.

The flow rate adjusting valve 196 is inserted between a part where the three bypass lines 197, 198, and 199 are combined and the exhaust pump 191. An exhaust flow rate in the gas exhaust pipe 88 is also adjustable by the flow rate adjusting valve 196. An exhaust flow rate determined by the flow rate adjusting valve 196 is changeable under control by the controller 3. The three bypass lines 197, 198, and 199 are mechanisms for adjusting an exhaust flow rate discontinuously at multiple stages. By contrast, the flow rate adjusting valve 196 is a mechanism for adjusting an exhaust flow rate continuously without stages.

The gas supply pipe 83, the gas exhaust pipe 88, and the three bypass lines 197, 198, and 199 are made of stainless steel having excellent strength and excellent corrosion resistance. A manometer 180 that measures pressure in the heat treatment space 65 is provided in the chamber 6.

Figure 2:
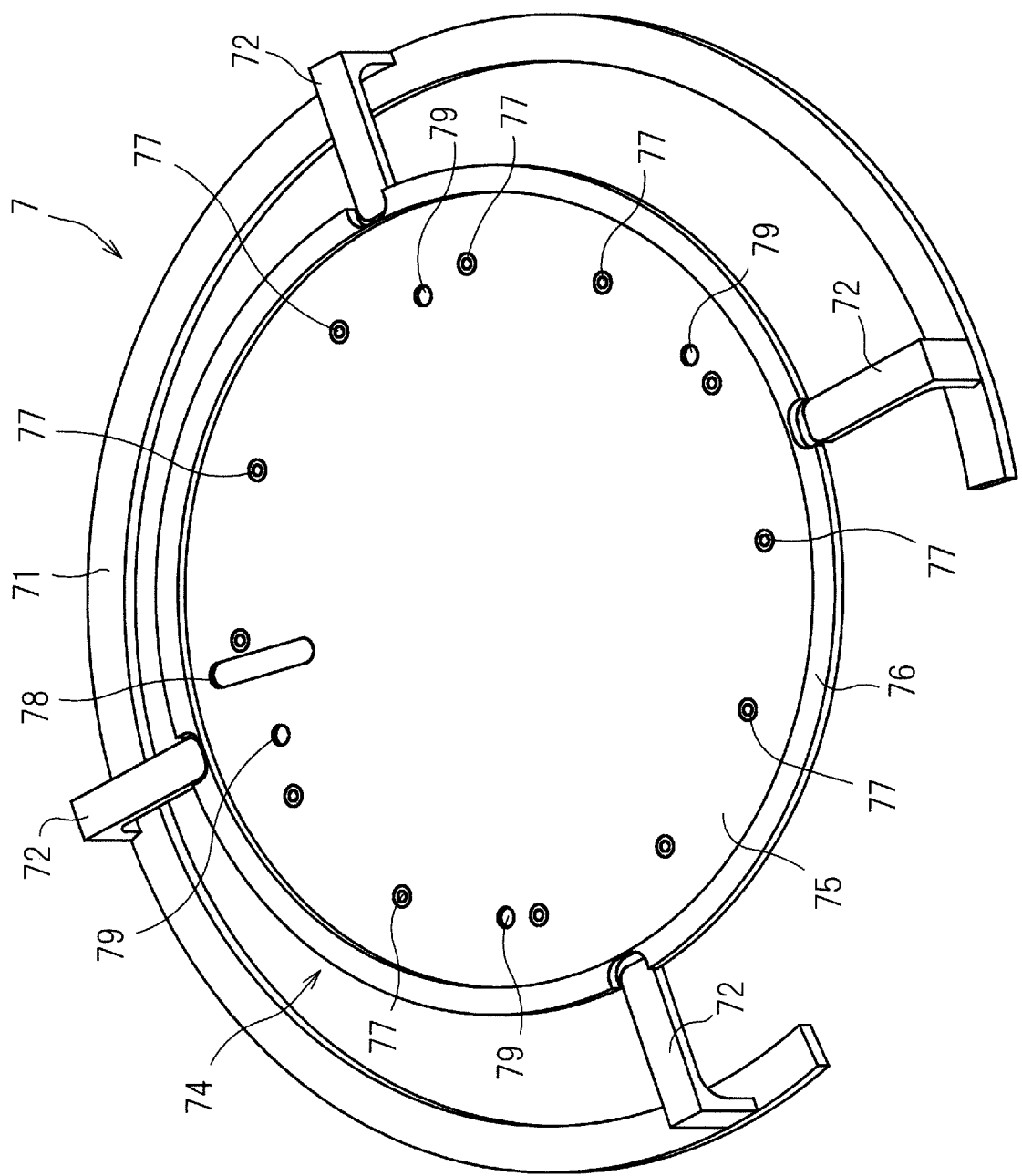
FIG. 2 is a perspective view showing the entire external appearance of a holder.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in this preferred embodiment, four coupling portions 72) are mounted upright on the upper surface of the base ring 71 and arranged in a circumferential direction of the annular shape thereof. The coupling portions 72 are also quartz members, and are rigidly secured to the base ring 71 by welding.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, if the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In this preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (a distance between opposed ones of the substrate support pins 77) is smaller than the diameter of the semiconductor wafer W, and is from 270 to 280 mm (in this preferred embodiment, 270 mm) if the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for the radiation thermometer 20 to receive radiation (infrared radiation) emitted from the lower surface of the semiconductor wafer W. Specifically, the radiation thermometer 20 receives the radiation emitted from the lower surface of the semiconductor wafer W through the opening 78 and the transparent window 21 mounted to the through hole 61a in the chamber side portion 61 to measure the temperature of the semiconductor wafer W. The holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
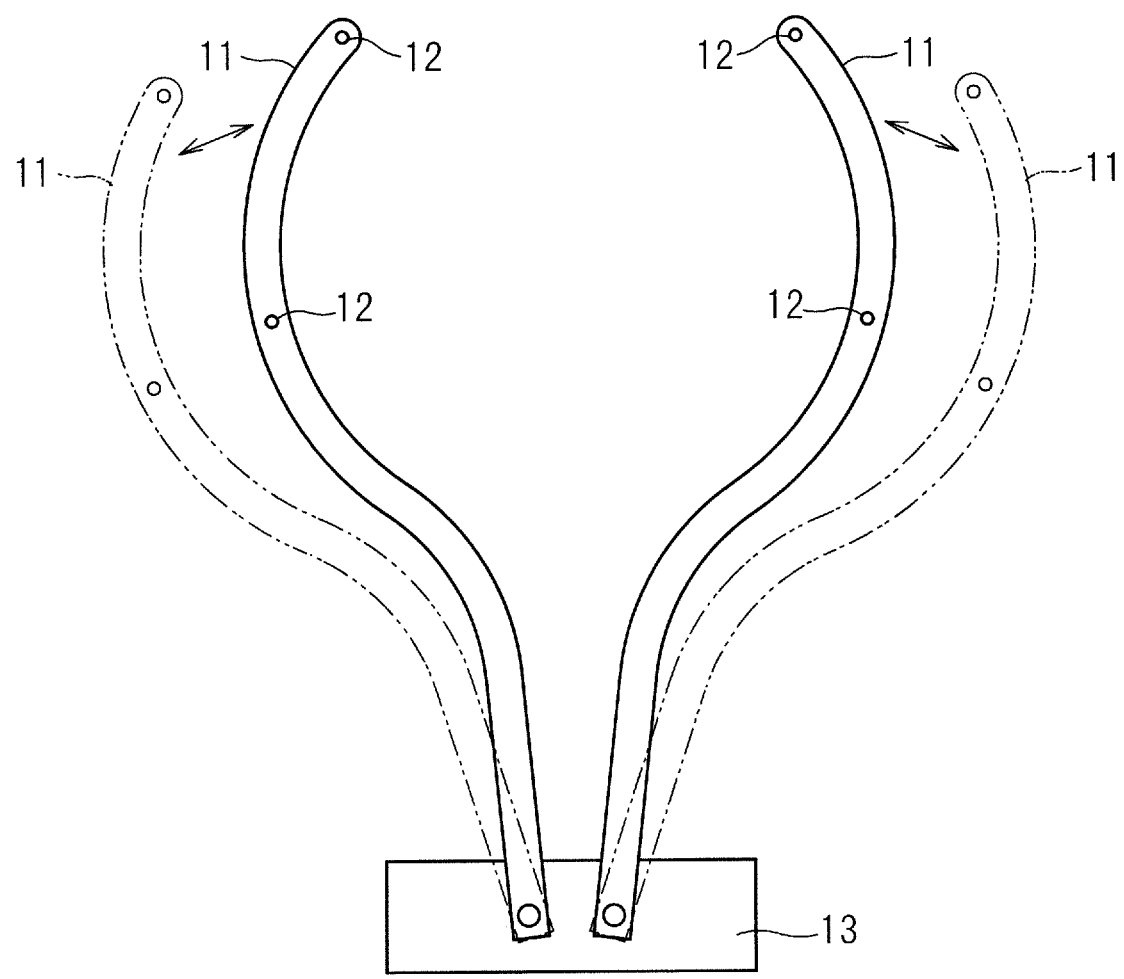
FIG. 5 is a plan view of a transfer mechanism.
Figure 6:
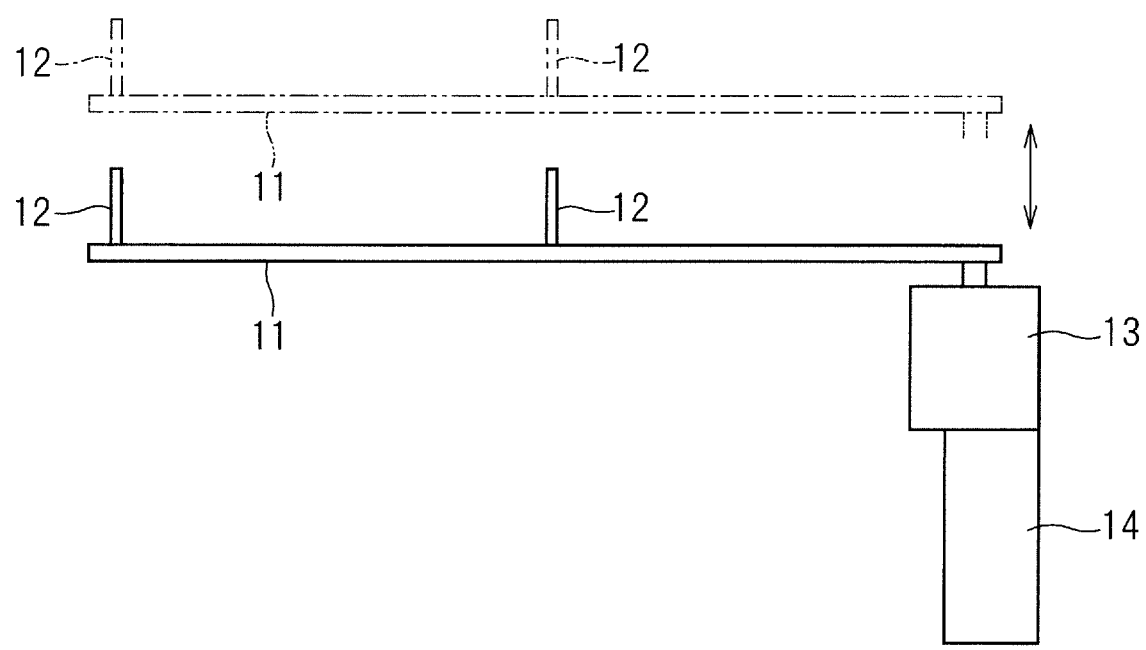
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7, and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively, or of the type which uses a linkage mechanism to cause a single motor to pivot the pair of transfer arms 11 in cooperative relation.

The pair of transfer arms 11 is moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in this preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. A region in which the flash lamps FL are arranged has a size, as seen in plan view, greater than that of the semiconductor wafer W.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL, because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period less than one second. The light emission time of the flash lamps FL is adjustable using the coil constant of a lamp light source which supplies power to the flash lamps FL. Further, the energy of flashes of light emitted from the flash lamps FL is adjustable using a voltage to be charged to a capacitor of the lamp light source.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in this preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into inert gas such as nitrogen, argon and the like is sealed in the glass tube. The introduction of the halogen element allows the temperature of the filament to be set at a high temperature while suppressing a break in the filament. Thus, the halogen lamps HL have the properties of having a long life and being capable of continuously emitting intense light, compared with typical incandescent lamps. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the foregoing various operating mechanisms provided in the heat treatment apparatus 1. The controller 3 is similar in hardware structure to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the treatment in the heat treatment apparatus 1 proceeds. Further, the controller 3 controls the supply valve 84, the exhaust valve 89, the flow rate adjusting valve 90, the flow rate adjusting valve 196, the exhaust pump 191, and the three exhaust valves 192, 193, and 194 to adjust, a gas supply flow rate, an exhaust flow rate and pressure in the heat treatment space 65 in the chamber 6.

The heat treatment apparatus 1 further includes, in addition to the foregoing components, various cooling structures to prevent an excessive temperature increase in the halogen heating part 4, the flash heating part 5, and the chamber 6 caused by the heat energy generated from the halogen lamps HL and the flash lamps FL during the heat treatment on a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, operation in the heat treatment apparatus 1 having the foregoing configuration will be described. Described first is removal of particles in the chamber 6 at the time of maintenance, for example. Described next is a procedure for treatment on a semiconductor wafer W in the heat treatment apparatus 1. The heat treatment apparatus 1 is subjected to maintenance at regular or irregular intervals. Maintenance at regular intervals is intended to check the heat treatment apparatus 1 and conserve the function of the heat treatment apparatus 1. Maintenance at irregular intervals is done on the occurrence of trouble such as a crack in a semiconductor wafer W. In either case, maintenance work is done while the chamber 6 is opened. When the chamber 6 is opened, particles flow in large quantities into the chamber 6 together with an outside atmosphere.

After the maintenance work is finished, the chamber 6 is closed again and the heat treatment space 65 becomes an enclosed space. Meanwhile, the particles in large quantities remain in the chamber 6. In particular, if a semiconductor wafer W is broken into tiny pieces by flash irradiation, particles in considerably large quantities remain in the chamber 6. If a semiconductor wafer W is treated while the particles in large quantities are left unremoved in the chamber 6, the particles may adhere to this semiconductor wafer W to cause the risk of treatment failure. In response to this issue, in this preferred embodiment, the particles in the chamber 6 are removed by the following way. The following procedure in the heat treatment apparatus 1 proceeds under control by the controller 3 over the operating mechanisms of the heat treatment apparatus 1.

In the first preferred embodiment, a dummy wafer is first transported into the chamber 6 of the heat treatment apparatus 1. The dummy wafer is a silicon wafer having the same size as a semiconductor wafer W as a target and a bare wafer without a pattern. For incoming transport of the dummy wafer, the gate valve 185 is opened and the transport opening 66 is opened. Then, a transport robot outside the apparatus transports the dummy wafer into the heat treatment space 65 in the chamber 6 through the transport opening 66.

The dummy wafer transported into the heat treatment space 65 by the transport robot is moved forward to a position immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the dummy wafer. At this time, the lift pins 12 move upwardly to above the upper ends of the substrate support pins 77.

After the dummy wafer is placed on the lift pins 12, the transport robot moves out of the heat treatment space 65, and the gate valve 185 closes the transport opening 66. Then, the pair of transfer arms 11 moves downwardly to transfer the dummy wafer from the transfer mechanism 10 to the susceptor 74 of the holder 7, so that the dummy wafer is held in a horizontal attitude from below. The dummy wafer is supported by the substrate support pins 77 provided upright on the holding plate 75, and is held by the susceptor 74. A predetermined distance is defined between the lower surface of the dummy wafer supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

Figure 9:
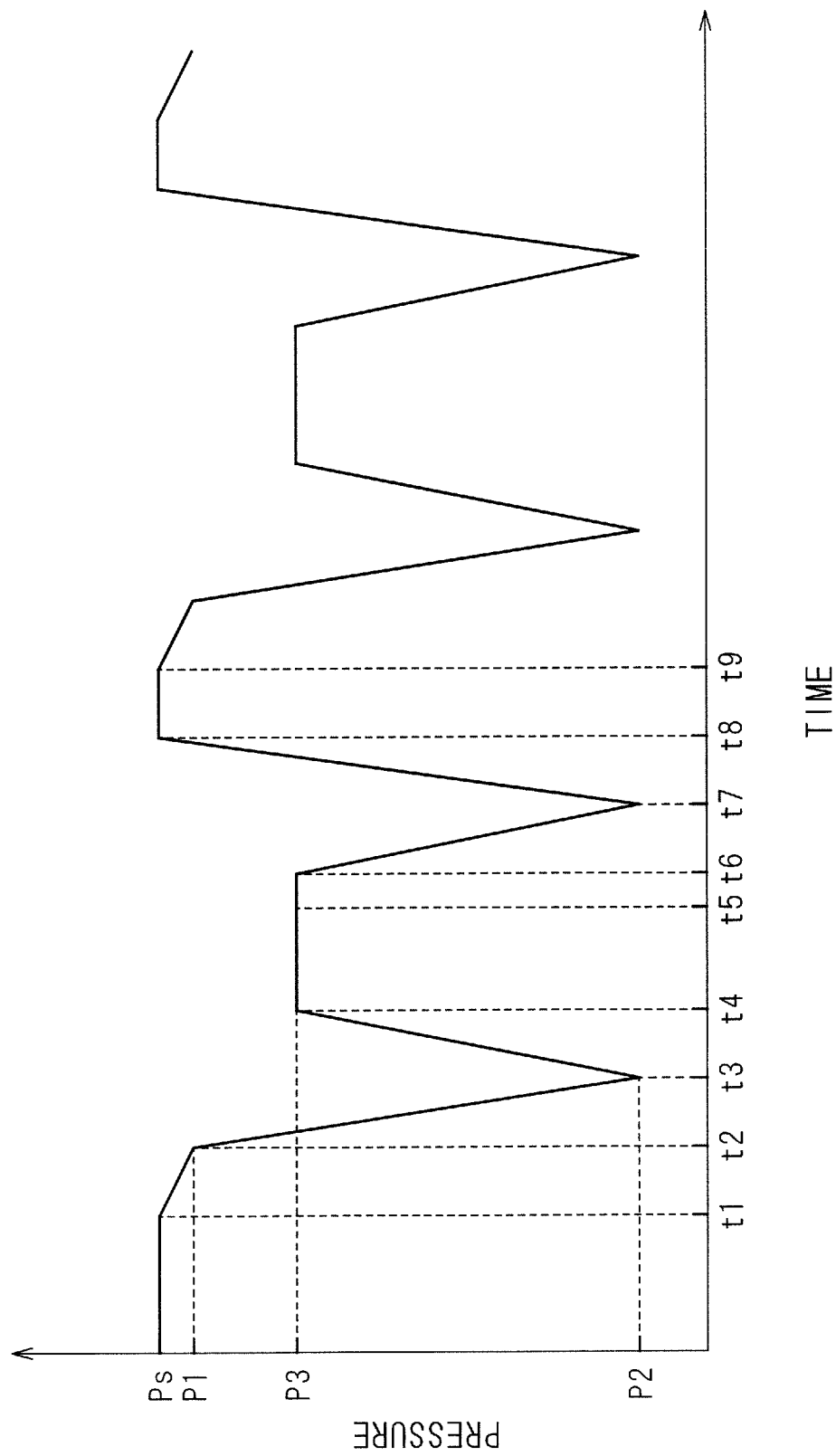
FIG. 9 shows pressure change in a chamber according to a first preferred embodiment.

After the dummy wafer is housed in the chamber 6 and the transport opening 66 is closed by the gate valve 185, pressure in the chamber 6 is reduced to pressure less than atmospheric pressure. FIG. 9 shows pressure change in the chamber 6 according to the first preferred embodiment. In FIG. 9, a horizontal axis shows time and a vertical axis shows pressure in the chamber 6. As the dummy wafer is housed in the chamber 6 and the transport opening 66 is closed, the heat treatment space 65 in the chamber 6 becomes an enclosed space. At this time, pressure in the chamber 6 is atmospheric pressure Ps (about 101325 Pa). In this state, while the supply valve 84 for supply of gas is closed, the exhaust valve 89 is opened at time t1. Further, the controller 3 opens the exhaust valve 192 at the bypass line 197 having the smallest pipe diameter out of the three bypass lines 197, 198, and 199 while operating the exhaust pump 191. The other exhaust valves 193 and 194 are closed. By doing so, gas is exhausted from the chamber 6 while gas is not supplied into the chamber 6, thereby reducing pressure in the heat treatment space 65 in the chamber 6. In an initial stage of pressure reduction, only the bypass line 197 is used having the smallest pipe diameter out of the three bypass lines 197, 198, and 199. Thus, gas is exhaust at a low flow rate and at relatively low exhaust speed.

At subsequent time t2 when pressure in the chamber 6 is reduced to pressure P1 (20000 Pa, for example), the controller 3 opens all the three exhaust valves 192, 193, and 194. By doing so, gas is exhausted from the chamber 6 at an increased flow rate and at increased exhaust speed. At time t3, pressure (degree of vacuum) in the chamber 6 reaches pressure P2. The pressure P2 is about 100 Pa, for example. Specifically, gas is exhausted at a low exhaust flow rate in the initial stage of pressure reduction and then a higher exhaust flow rate is employed for subsequent exhaust. In this preferred embodiment, a flow rate determined by the flow rate adjusting valve 196 is constant.

At the time t3 when pressure in the chamber 6 reaches pressure P2, the supply valve 84 is opened while the exhaust valve 89 and the exhaust valves 192, 193, and 194 are opened to supply nitrogen gas from the treatment gas supply source 85 into the heat treatment space 65 in the chamber 6. Pressure in the chamber 6 is increased by the supply of nitrogen gas into the chamber 6 from the pressure P2 to reach pressure P3 at time t4. The pressure P3 is higher than the pressure P2 and less than the atmospheric pressure Ps. The pressure P3 is about 5000 Pa, for example. In a time period after the time t4 when pressure in the chamber 6 is increased to the pressure P3, pressure in the chamber 6 is maintained at the pressure P3 by supplying nitrogen gas into the chamber 6 and exhausting gas in the chamber 6 at respective flow rates substantially equal to each other.

In a time period after the time t4 when pressure in the chamber 6 is increased to the pressure P3, the 40 halogen lamps HL in the halogen heating part 4 turn on to irradiate the interior of the chamber 6 with light to heat the dummy wafer. The halogen light emitted from the halogen lamps HL is transmitted through the lower chamber window 64 and the susceptor 74 both made of quartz, and impinges upon the lower surface of the dummy wafer. By receiving the halogen light irradiation from the halogen lamps HL, the dummy wafer is increased in temperature. Increase in temperature of the dummy wafer heats the interior of the chamber 6 indirectly.

Next, at time t5 when a predetermined time period has passed since start of the light irradiation from the halogen lamps HL, the flash lamps FL in the flash heating part 5 emit flashes of light. The flashes of light emitted from the flash lamps FL are transmitted through the upper chamber window 63, and impinge upon the upper surface of the dummy wafer. The flashes of light from the flash lamps FL are intense flashes of light emitted for an extremely short time period ranging from about 0.1 to about 100 milliseconds as a result of conversion of electrostatic energy previously stored in the capacitor into such an ultrashort light pulse. Thus, irradiating the dummy wafer with the flashes of light from the flash lamps FL can increase the temperature of the upper surface of the dummy wafer momentarily. Immediately after the irradiation with the flashes of light, the temperature of the upper surface of the dummy wafer decreases rapidly.

As a result of irradiation of the interior of the chamber 6 with the extremely intense flashes of light emitted for a short time period, momentary gas expansion and subsequent gas shrinkage occur in the chamber 6. This causes particles adhering to the interior of the chamber 6 (in particular, particles deposited on the lower chamber window 64) to swirl up to fly in the heat treatment space 65.

While the interior of the chamber 6 is placed in a reduced-pressure atmosphere less than atmospheric pressure by supplying nitrogen gas into the chamber 6 and exhausting gas in the chamber 6 at respective flow rates substantially equal to each other, the interior of the chamber 6 is irradiated with the flashes of light to cause particles to fly. This causes the particles to fly from the gas exhaust opening 86 toward the gas exhaust pipe 88 to allow discharge of the particles.

The energy of the flashes of light emitted from the flash lamps FL at the time t5 is equal to or greater than the energy of flashes of light to be emitted from the flash lamps FL to a semiconductor wafer W as a target described later. More specifically, a higher voltage is charged to the capacitor than a voltage to be used for flash irradiation of the semiconductor wafer W to be actually treated. This causes particles in the chamber 6 to swirl up to discharge the particles from the chamber 6 more effectively.

At time t6 after the flash irradiation is finished, the controller 3 closes the supply valve 84 for reducing pressure in the chamber 6 again to the pressure P2. At subsequent time t7 when pressure in the chamber 6 reaches the pressure P2, the controller 3 closes the exhaust valve 89 and opens the supply valve 84 to supply nitrogen gas into the chamber 6 from the treatment gas supply source 85, thereby increasing pressure in the chamber 6 to the atmospheric pressure Ps. Further, the halogen lamps HL turn off. This decreases the temperature of the dummy wafer further. After pressure in the chamber 6 is increased to the atmospheric pressure Ps at time t8, the pair of transfer arms 11 of the transfer mechanism 10 is moved horizontally again from the retracted position to the transfer operation position and is then moved upwardly. By doing so, the lift pins 12 protrude from the upper surface of the susceptor 74 to receive the dummy wafer from the susceptor 74. Subsequently, the transport opening 66 which has been closed by the gate valve 185 is opened, and the transport robot outside the heat treatment apparatus 1 transports the dummy wafer placed on the lift pins 12 to the outside.

Next, a new dummy wafer is transported into the chamber 6. At time t9, exhaust using only the bypass line 197 having the smallest pipe diameter is started again to reduce pressure in the chamber 6. A procedure to be followed in the heat treatment apparatus 1 after the time t9 is the same as the foregoing procedure followed after the time t1. The procedure from the time t1 to the time t8 is followed to treat multiple dummy wafers. Specifically, the procedure from the time t1 to the time t8 is repeated multiple times (in this preferred embodiment, 25 times, for example).

While the interior of the chamber 6 is placed in a reduced-pressure atmosphere less than atmospheric pressure by supplying nitrogen gas into the chamber 6 of the heat treatment apparatus 1 and exhausting gas in the chamber 6 at respective flow rates substantially equal to each other, the interior of the chamber 6 is irradiated with flashes of light multiple times to cause particles to fly and discharge the particles. By doing so, the particles in the chamber 6 mixed into the chamber 6 at the time of maintenance, etc. can be removed. In particular, according to the technique of the present invention, flashes of light are emitted multiple times while the interior of the chamber 6 is in a reduced-pressure state. This allows particles to be discharged efficiently from the chamber 6.

During flash irradiation, the interior of the chamber 6 is maintained in a reduced-pressure atmosphere while nitrogen gas is supplied to the chamber 6. This allows flying particles to be discharged efficiently from the chamber 6 together with a flow of the supplied nitrogen gas.

Additionally, in the first preferred embodiment, the dummy wafer is transported into the chamber 6 and held by the susceptor 74. The dummy wafer is heated by irradiation with light from the halogen lamps HL before being irradiated with flashes of light, thereby heating the interior of the chamber 6 indirectly. This generates convection in the chamber 6 resulting from temperature increase in the chamber 6. Thus, at the time of the flash irradiation, the heat convection functions together with momentary gas expansion and gas shrinkage to cause particles to fly in the chamber 6 and discharge the particles from the chamber 6 more effectively. The flying particles adhere to the dummy wafer, so that the particles can be removed by transporting the dummy wafer out of the chamber 6. Additionally, by emitting flashes of light from the flash lamps FL with the dummy wafer held by the susceptor 74, the flashes of light are blocked by the dummy wafer. This prevents damage on the halogen lamps HL due to direct irradiation with the flashes of light.

After the cleaning by the foregoing removal of particles is finished, a semiconductor wafer W as a target is treated in the heat treatment apparatus 1. A procedure for the treatment on the semiconductor wafer W as a target will be described next. First, the semiconductor wafer W as a target is transported into the chamber 6 of the heat treatment apparatus 1. The incoming transport of the semiconductor wafer W is the same as the foregoing incoming transport of the dummy wafer. At the time of the incoming transport of the semiconductor wafer W as a target, nitrogen gas may be supplied continuously from the treatment gas supply source 85 into the chamber 6 by opening the supply valve 84 to make a nitrogen gas flow get out of the chamber 6 through the transport opening 66, thereby minimizing flow of an atmosphere outside the apparatus into the chamber 6. While the gate valve 185 is opened, exhaust from the chamber 6 is preferably stopped by closing the exhaust valve 89. This causes the nitrogen gas supplied into the chamber 6 to flow out of the chamber 6 only through the transport opening 66, thereby preventing incoming flow of the outside atmosphere more effectively.

After the semiconductor wafer W is housed in the chamber 6 and held by the susceptor 74 and the transport opening 66 is closed by the gate valve 185, pressure in the chamber 6 is reduced to pressure less than atmospheric pressure. Pressure change in the chamber 6 occurring after start of the pressure reduction is substantially equal to the pressure change occurring during the foregoing removal of particles (see FIG. 9). In other words, at the time of removal of particles, pressure in the chamber 6 is reduced by following a pressure-reducing pattern same as a pressure-reducing pattern for the semiconductor wafer W as a target. Specifically, gas is exhausted at a low exhaust flow rate in an initial stage of pressure reduction. Then, a higher exhaust flow rate is employed for subsequent exhaust. This change in an exhaust flow rate is made for the following reason. If exhaust proceeds rapidly at a high exhaust flow rate from the start of the pressure reduction, large gas flow change may occur in the chamber 6 and particles in tiny quantities remaining on a component of the chamber 6 (lower chamber window 64, for example) may swirl up to again adhere to the semiconductor wafer W, causing the risk of contamination of the semiconductor wafer W. Exhausting gas gently at a low exhaust flow rate in the initial stage of the pressure reduction and then employing a higher exhaust flow rate for subsequent exhaust allows prevention of the occurrence of such swirling up of particles in the chamber 6.

When pressure in the chamber 6 reaches the pressure P2, the supply valve 84 for supply of gas is opened and treatment gas is supplied from the treatment gas supply source 85 to the heat treatment space 65 in the chamber 6. Treatment gas responsive to a purpose of treatment on the semiconductor wafer W is applicable. For example, mixed gas containing ammonia and nitrogen gas may be supplied to form an ammonia atmosphere in the heat treatment space 65.

As a result of supply of the treatment gas into the chamber 6, pressure in the chamber 6 increases from the pressure P2 to the pressure P3. When pressure in the chamber 6 is increased to the pressure P3, pressure in the chamber 6 is maintained at the pressure P3 by supplying the treatment gas into the chamber 6 and exhausting gas in the chamber 6 at respective flow rates substantially equal to each other.

After pressure in the chamber 6 is increased to the pressure P3, the 40 halogen lamps HL in the halogen heating part 4 turn on simultaneously to start preheating (or assist-heating) on the semiconductor wafer W. By receiving light emission from the halogen lamps HL, the semiconductor wafer W is preheated to increase in temperature. The temperature of the semiconductor wafer W is measured with the radiation thermometer 20 when the halogen lamps HL perform the preheating. Specifically, the radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while checking to see whether the temperature of the semiconductor wafer W being increased by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 20.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in the peripheral portion thereof where heat dissipation is liable to occur than in the central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Pressure in the chamber 6 in the preheating stage is maintained at the pressure P3.

When a predetermined time period has passed since the temperature of the semiconductor wafer W reached the preheating temperature T1, the flash lamps FL in the flash heating part 5 irradiate a surface of the semiconductor wafer W held by the susceptor 74 with flashes of light. The energy of the flashes of light emitted from the flash lamps FL at this time is equal to or less than the energy of flashes of light emitted during the foregoing removal of particles. Thus, it is substantially unlikely that additional particles will be caused to fly in the chamber 6 by this flash irradiation.

The flash heating, which is achieved by the emission of flashes of light from the flash lamps FL, is capable of increasing the temperature of the surface of the semiconductor wafer W in a short time period. Specifically, the surface of the semiconductor wafer W is irradiated with the flashes of light from the flash lamps FL to increase the temperature of the surface of the semiconductor wafer W momentarily to a treatment temperature T2. Then, the temperature of the surface of the semiconductor wafer W decreases rapidly. The flashes of light from the flash lamps FL are emitted for a short time period ranging from about 0.1 to about 100 milliseconds. Thus, increasing the temperature of the surface of the semiconductor wafer W from the preheating temperature T1 to the treatment temperature T2 also requires an extremely short time period of less than one second.

When a predetermined time period has passed since completion of the flash heating treatment, the supply valve 84 is closed and pressure in the chamber 6 is reduced again to the pressure P2. This allows discharge of harmful ammonia from the heat treatment space 65 in the chamber 6 if mixed gas containing ammonia and nitrogen gas is used as treatment gas. Next, when pressure in the chamber 6 reaches the pressure P2, the exhaust valve 89 is closed and the supply valve 84 is opened to supply nitrogen gas as inert gas into the chamber 6 from the treatment gas supply source 85, thereby increasing pressure in the chamber 6 to the atmospheric pressure Ps. Further, the halogen lamps HL turn off. This decreases the temperature of the semiconductor wafer W from the preheating temperature T1. The radiation thermometer 20 measures the temperature of the semiconductor wafer W which is on the decrease. A result of the measurement is transmitted to the controller 3. The controller 3 checks to see whether the temperature of the semiconductor wafer W has decreased to a predetermined temperature or not, based on the result of the measurement. After an atmosphere in the chamber 6 is replaced by a nitrogen atmosphere, pressure in the chamber 6 is increased to the atmospheric pressure Ps, and the temperature of the semiconductor wafer W is decreased to the predetermined temperature or less, the pair of transfer arms 11 of the transfer mechanism 10 is moved horizontally again from the retracted position to the transfer operation position and is then moved upwardly. By doing so, the lift pins 12 protrude from the upper surface of the susceptor 74 to receive the heat-treated semiconductor wafer W from the susceptor 74. Subsequently, the transport opening 66 which has been closed by the gate valve 185 is opened, and the transport robot outside the heat treatment apparatus 1 transports the semiconductor wafer W placed on the lift pins 12 to the outside. In this way, the heat treatment apparatus 1 completes the heat treatment on the semiconductor wafer W.

Figure 10:
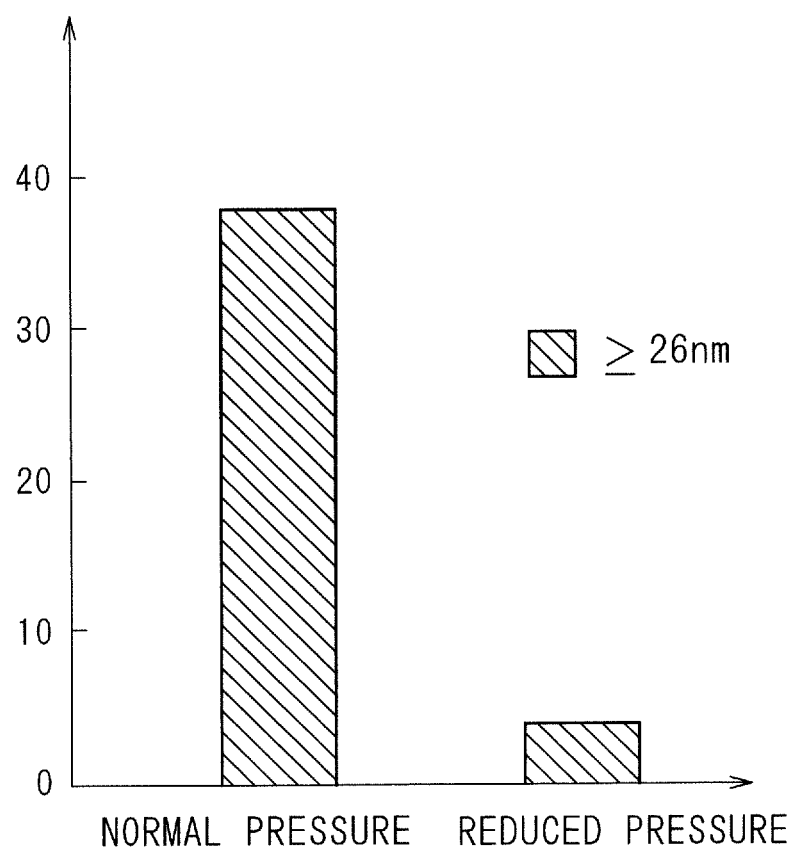
FIG. 10 shows effect achieved by emitting a flash of light while the interior of the chamber is in a reduced-pressure atmosphere.

In the first preferred embodiment, while the interior of the chamber 6 of the heat treatment apparatus 1 is placed in a reduced-pressure atmosphere by exhausting gas in the chamber 6, the interior of the chamber 6 is irradiated with flashes of light emitted multiple times from the flash lamps FL to discharge particles flying in the chamber 6. This allows removal of particles in the chamber 6 with a high degree of accuracy. FIG. 10 shows effect achieved by emitting a flash of light while the interior of the chamber 6 is in a reduced-pressure atmosphere. FIG. 10 shows the number of particles adhering to a semiconductor wafer W when the semiconductor wafer W as a target is transported into the chamber 6 from which particles have been removed in the way described in this preferred embodiment and then the semiconductor wafer W is treated in the chamber 6. FIG. 10 further includes a comparative example showing the number of particles adhering to a semiconductor wafer W when the semiconductor wafer W is transported into the chamber 6 at normal pressure and treated in the chamber 6 after the chamber 6 is irradiated with flashes of light emitted multiple times. FIG. 10 shows that discharging particles from the chamber 6 by irradiation with the flashes of light emitted multiple times with the interior of the chamber 6 placed in a reduced-pressure atmosphere like in this preferred embodiment achieves significant reduction in tiny particles of 26 nm or more adhering to the treated semiconductor wafer W, compared to flash irradiation at normal pressure.

Second Preferred Embodiment

A second preferred embodiment of the present invention will be described next. The configuration of a heat treatment apparatus 1 of the second preferred embodiment is exactly the same as the configuration of the first preferred embodiment. A procedure for treatment on a semiconductor wafer W in the heat treatment apparatus 1 of the second preferred embodiment is also substantially the same as the procedure of the first preferred embodiment. The second preferred embodiment differs from the first preferred embodiment in operation during removal of particles.

In the second preferred embodiment, a dummy wafer is not used. Specifically, while a wafer does not exist the chamber 6, flashes of light are emitted from the flash lamps FL to the interior of the chamber 6 to cause particles to fly.

FIG. 11 shows pressure change in the chamber 6 according to the second preferred embodiment. In the second preferred embodiment, transport of a wafer into the chamber 6 is prohibited during removal of particles. Specifically, both a semiconductor wafer W as a target and a dummy wafer are not to be transported into the chamber 6.

While the transport opening 66 is closed by the gate valve 185 and an enclosed space is formed in the chamber 6 (pressure in the chamber 6 is the atmospheric pressure Ps), exhaust of gas is started at time t11 by opening the exhaust valve 89 while the supply valve 84 for supply of gas is closed. The three bypass lines 197, 198, and 199 are opened appropriately. By doing so, gas is exhausted from the chamber 6 without supplying gas into the chamber 6, thereby reducing pressure in the heat treatment space 65 in the chamber 6.

At time t12 when pressure in the chamber 6 is reduced to pressure P4 (5000 Pa, for example), the supply valve 84 is opened to supply nitrogen gas from the treatment gas supply source 85 into the heat treatment space 65 in the chamber 6. Pressure in the chamber 6 is maintained at the pressure P4 by supplying nitrogen gas into the chamber 6 and exhausting gas in the chamber 6 at respective flow rates substantially equal to each other.

In a time period after the time t12 when pressure in the chamber 6 is reduced to the pressure P4, the halogen lamps HL in the halogen heating part 4 turn on to irradiate the interior of the chamber 6 with light. In the second preferred embodiment, a dummy wafer does not exist in the chamber 6. As a result of the irradiation of the interior of the chamber 6 with the light from the halogen lamps HL, a component in the chamber 6 is directly irradiated with the light and heated.

Next, at time t13 when a predetermined time period has passed since start of the light irradiation from the halogen lamps HL, the flash lamps FL in the flash heating part 5 emit flashes of light to the interior of the chamber 6. A dummy wafer does not exist in the chamber 6. Meanwhile, as a result of irradiation of the interior of the chamber 6 with the extremely intense flashes of light emitted for a short time period, momentary gas expansion and subsequent gas shrinkage occur in the chamber 6, like in the first preferred embodiment. This causes particles adhering to the interior of the chamber 6 to swirl up to fly in the heat treatment space 65.

While the interior of the chamber 6 is placed in a reduced-pressure atmosphere less than atmospheric pressure by supplying nitrogen gas into the chamber 6 and exhausting gas in the chamber 6 at respective flow rates substantially equal to each other, the interior of the chamber 6 is irradiated with the flashes of light to cause particles to fly. This causes the particles to fly from the gas exhaust opening 86 toward the gas exhaust pipe 88 to allow discharge of the particles.

The energy of the flashes of light emitted from the flash lamps FL at the time t13 is equal to or greater than the energy of flashes of light to be emitted from the flash lamps FL to a semiconductor wafer W as a target. This causes particles in the chamber 6 to swirl up to discharge the particles from the chamber 6 more effectively.

In the second preferred embodiment, a dummy wafer does not exist in the chamber 6. Meanwhile, as a result of irradiation with the light from the halogen lamps HL, a component in the chamber 6 is directly heated to generate gentle convection in the chamber 6. This allows slight increase in the efficiency in discharge of particles.

Next, at time t14 when a predetermined time period has passed, the flash lamps FL in the flash heating part 5 emit flashes of light again to the interior of the chamber 6. This causes particles to swirl up to fly in the chamber 6, and the particles are discharged from the chamber 6. The halogen lamps HL emit light continuously to the chamber 6. In a subsequent time period, the flash lamps FL emit flashes of light to the interior of the chamber 6 at constant intervals (next emission occurs at time t15) multiple times (25 times, for example). Each time the flashes of light are emitted, particles fly in the chamber 6 and are discharged from the chamber 6.

Also in the second preferred embodiment, while the interior of the chamber 6 of the heat treatment apparatus 1 is placed in a reduced-pressure atmosphere by exhausting gas in the chamber 6, the interior of the chamber 6 is irradiated with flashes of light emitted multiple times from the flash lamps FL to discharge particles flying in the chamber 6. This allows removal of particles in the chamber 6 with a high degree of accuracy.

Further, during flash irradiation, the interior of the chamber 6 is maintained in a reduced-pressure atmosphere while nitrogen gas is supplied to the chamber 6. This allows flying particles to be discharged efficiently from the chamber 6 together with a flow of the supplied nitrogen gas.

In the second preferred embodiment, the interior of the chamber 6 is irradiated with flashes of light while transport of a substrate including a dummy wafer into the chamber 6 is prohibited. Thus, during removal of particles, the risk of occurrence of additional particles due to a crack in a dummy wafer caused by flash irradiation is prevented. Meanwhile, like in the first preferred embodiment, irradiating the interior of the chamber 6 with flashes of light with a dummy wafer held in the chamber 6 is more preferable in terms of increasing efficiency in discharge of particles by generating intense convection in the chamber 6. Using a dummy wafer allows removal of flying particles by causing the particles to adhere to the dummy wafer.

MODIFICATIONS

While the preferred embodiments according to the present invention have been described hereinabove, various modifications of the present invention in addition to those described above may be made without departing from the scope and spirit of the invention. For example, multiple dummy wafers are used in the first preferred embodiment. Alternatively, the heat treatment apparatus 1 may perform operation comparable to the operation in the first preferred embodiment to remove particles without using a dummy wafer. Specifically, while a dummy wafer is not actually used, the gate valve 185 and the transfer mechanism 10 are driven on the assumption that a virtual dummy wafer is used. While pressure in the chamber 6 is changed in the way shown in FIG. 9, the interior of the chamber 6 in a reduced-pressure state is irradiated with flashes of light emitted multiple times from the flash lamps FL. This also causes particles to fly in the chamber 6 to allow discharge and removal of the particles. Like the second preferred embodiment, this prevents the risk of occurrence of additional particles due to a crack in a dummy wafer during removal of the particles. However, compared to the first preferred embodiment, this unavoidably causes reduction in efficiency in discharge of particles.

In the foregoing preferred embodiments, during flash irradiation, the interior of the chamber 6 is maintained in a reduced-pressure atmosphere while nitrogen gas is supplied to the chamber 6. Alternatively, particles may be discharged by flash irradiation while the chamber 6 is placed in a reduced-pressure atmosphere with the supply valve 84 closed to supply no gas to the chamber 6.

In each of the foregoing preferred embodiments, flashes of light are emitted 25 times to the interior of the chamber 6 in a reduced-pressure state. However, the present invention is not limited to this. The number of times flashes of light are emitted may be determined appropriately. In terms of balance between efficiency in discharge of particles and a duration of treatment, the number of times flashes of light are emitted to the interior of the chamber 6 is preferably from 25 to 50.

In each of the foregoing preferred embodiments, flashes of light are emitted multiple times while the interior of the chamber 6 is in a reduced-pressure atmosphere of 5000 Pa. However, the present invention is not limited to this. Pressure in the chamber 6 during irradiation with flashes of light for removing particles is only required to range from 0.5 to 90000 Pa. Irradiating the interior of the chamber 6 with flashes of light multiple times with the interior of the chamber 6 placed in a reduced-pressure atmosphere from 0.5 to 90000 Pa allows flying particles to be discharged efficiently from the chamber 6.

When the interior of the chamber 6 is heated by being irradiated with light from the halogen lamps HL, temperature in the chamber 6 is preferably from room temperature to 500° C. Heating the interior of the chamber 6 up to 500° C. requires holding of a dummy wafer in the chamber 6 and heating the dummy wafer to 500° C. or more by irradiation with light from the halogen lamps HL, like in the first preferred embodiment. By contrast, if the interior of the chamber 6 is to be placed at room temperature, irradiation with light from the halogen lamps HL is omissible.

While the 30 flash lamps FL are provided in the flash heating part 5 in the foregoing preferred embodiments, the present invention is not limited to this. Any number of flash lamps FL may be provided. The flash lamps FL are not limited to xenon flash lamps, but may be krypton flash lamps. Also, the number of halogen lamps HL provided in the halogen heating part 4 is not limited to 40. Any number of halogen lamps HL may be provided.

In the foregoing preferred embodiments, the filament-type halogen lamps HL are used as continuous lighting lamps that emit light continuously for not less than one second to preheat a semiconductor wafer W. The present invention, however, is not limited to this. In place of the halogen lamps HL, discharge type arc lamps (e.g., xenon arc lamps) may be used as continuous lighting lamps. In this case, the interior of the chamber 6 is also heated by light irradiation from the arc lamps during cleaning.

Moreover, a substrate as a target of treatment by the heat treatment apparatus 1 is not limited to a semiconductor wafer, but may be a glass substrate for use in a flat panel display such as a liquid crystal display device or an organic electroluminescence (EL) device, and a substrate for a solar cell.

While the invention has been described in detail, the foregoing description is in all aspects illustrative and not restrictive. It is therefore understood that numerous modifications and variations can be devised without departing from the scope of the invention.

What is claimed is:

1. A particle removal method of removing particles from a heat treatment apparatus for heating a substrate by irradiating the substrate with a flash of light, the method comprising:
    irradiating an interior of a chamber of said heat treatment apparatus with a flash of light emitted multiple times from a flash lamp to discharge particles flying in said chamber, at a time of maintenance of said heat treatment apparatus, while the interior of said chamber of said heat treatment apparatus is placed in a reduced-pressure atmosphere by exhausting gas in said chamber, and subsequently, the interior of said chamber is maintained to be said reduced-pressure atmosphere while gas is supplied into said chamber,
    wherein the interior of said chamber is placed in said reduced-pressure atmosphere by exhausting gas in said chamber while transportation of a substrate into said chamber is prohibited and the substrate is absent in said chamber.

2. A particle removal method of removing particles from a heat treatment apparatus for heating a substrate by irradiating the substrate with a flash of light, the method comprising:
    irradiating an interior of a chamber of said heat treatment apparatus with a flash of light emitted multiple times from a flash lamp to discharge particles flying in said chamber, at a time of maintenance of said heat treatment apparatus, while the interior of said chamber of said heat treatment apparatus is placed in a reduced-pressure atmosphere by exhausting gas in said chamber, and subsequently, the interior of said chamber is maintained to be said reduced-pressure atmosphere while gas is supplied into said chamber, wherein
    the interior of said chamber is placed in said reduced-pressure atmosphere by exhausting gas in said chamber while a dummy wafer is held in said chamber.

3. The particle removal method according to claim 1, wherein
    the interior of said chamber is heated by being irradiated with light from a continuous lighting lamp at least before the irradiation with said flash of light.

4. The particle removal method according to claim 1, wherein
    said flash of light has energy equal to or greater than the energy of a flash of light to be emitted from said flash lamp to a substrate as a target of treatment.

5. The particle removal method according to claim 1, wherein
    said reduced-pressure atmosphere in said chamber is from 0.5 to 90000 Pa.

* * * * *